United States Patent
Hashimoto et al.

(10) Patent No.: US 10,811,293 B2
(45) Date of Patent: Oct. 20, 2020

(54) SUBSTRATE TRANSFER HAND, SUBSTRATE TRANSFER ROBOT, AND SUBSTRATE TRANSFER AND LOADING DEVICE

(71) Applicant: KAWASAKI JUKOGYO KABUSHIKI KAISHA, Kobe-shi, Hyogo (JP)

(72) Inventors: Yasuhiko Hashimoto, Kobe (JP); Tetsuya Yoshida, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 16/332,931

(22) PCT Filed: Sep. 8, 2017

(86) PCT No.: PCT/JP2017/032527
§ 371 (c)(1),
(2) Date: Mar. 13, 2019

(87) PCT Pub. No.: WO2018/051921
PCT Pub. Date: Mar. 22, 2018

(65) Prior Publication Data
US 2019/0252227 A1    Aug. 15, 2019

(30) Foreign Application Priority Data
Sep. 13, 2016 (JP) ................. 2016-178945

(51) Int. Cl.
*H01L 21/677* (2006.01)
*H01L 21/67* (2006.01)
(Continued)

(52) U.S. Cl.
CPC ........ *H01L 21/67742* (2013.01); *B65G 47/90* (2013.01); *H01L 21/67196* (2013.01);
(Continued)

(58) Field of Classification Search
CPC ......... H01L 21/67742; H01L 21/67196; H01L 21/57748; H01L 21/67766; H01L 21/68707; B65G 47/90
See application file for complete search history.

(56) References Cited

U.S. PATENT DOCUMENTS 6,142,722 A     11/2000  Genov et al.
6,918,731 B2 *   7/2005  Talmer ............. H01L 21/67201
                                                    414/217
(Continued)

FOREIGN PATENT DOCUMENTS

JP    2002-518838 A   6/2002
JP    2008-28134 A    2/2008
JP    2016-505219 A   2/2016

*Primary Examiner* — Saul Rodriguez
*Assistant Examiner* — Ashley K Romano
(74) *Attorney, Agent, or Firm* — Oliff PLC (57) ABSTRACT

A substrate transfer hand coupled to a robot arm includes a base part coupled to the robot arm; and a substrate holding part coupled to the base part to hold a substrate. When viewed in a substrate perpendicular line direction perpendicular to the substrate held by the substrate holding part, the substrate transfer hand is bent at a coupling portion at which the base part and the substrate holding part are coupled to each other or a region which is in the vicinity of the coupling portion, and the base part and the substrate transfer hand have a V-shape, as a whole.

4 Claims, 8 Drawing Sheets

(51) Int. Cl.
  *H01L 21/687* (2006.01)
  *B65G 47/90* (2006.01)
(52) U.S. Cl.
  CPC .. *H01L 21/67748* (2013.01); *H01L 21/67766* (2013.01); *H01L 21/68707* (2013.01)

(56) References Cited

U.S. PATENT DOCUMENTS

| | | | |
|---|---|---|---|
| 7,458,763 B2 * | 12/2008 | van der Meulen | H01L 21/6719 |
| | | | 414/805 |
| 7,950,407 B2 * | 5/2011 | Mimken | H01L 21/67057 |
| | | | 137/14 |
| 8,500,388 B2 * | 8/2013 | van der Meulen | B65G 25/02 |
| | | | 414/805 |
| 8,992,160 B2 * | 3/2015 | Furuichi | H01L 21/67742 |
| | | | 414/222.07 |
| 9,272,413 B2 * | 3/2016 | Furuichi | B25J 9/042 |
| 9,446,910 B2 * | 9/2016 | Kimura | B65G 47/90 |
| 9,947,565 B2 * | 4/2018 | Rebstock | H01L 21/67769 |
| 2008/0025824 A1 | 1/2008 | Hashimoto | |
| 2014/0205416 A1 | 7/2014 | Hosek et al. | |

\* cited by examiner

SUBSTRATE TRANSFER HAND, SUBSTRATE TRANSFER ROBOT, AND SUBSTRATE TRANSFER AND LOADING DEVICE

TECHNICAL FIELD

The present invention relates to a substrate transfer hand which holds and transfers substrates such as semiconductor wafers or glass substrates, a substrate transfer robot including this substrate transfer hand, and a substrate transfer and loading device (device for transferring and loading the substrates) including this substrate transfer robot.

BACKGROUND ART

Conventionally, substrate treatment equipment which performs process treatments such as element formation to semiconductor substrates (hereinafter will also be referred to as "substrates") which are semiconductor device manufacturing materials, is known. Typically, in the substrate treatment equipment, a process treatment device and a substrate transfer and loading device (device for transferring and loading the substrates) located adjacently to the process treatment device are placed.

For example, a substrate transfer and loading device disclosed in Patent Literature 1 includes a casing (housing) formed with a transfer room in an inside thereof, a plurality of load ports provided at the front wall of the casing, and a substrate transfer robot placed inside the transfer room. The substrate transfer robot includes a robot arm, and a substrate transfer hand coupled to the hand tip portion of the robot arm. This substrate transfer robot performs work operations such as loading and unloading the substrate to and from the process treatment device, taking the substrate out of a substrate carrier docked to the load port, and accommodating the substrate into the substrate carrier. As an example of the above-described substrate transfer and loading device, an equipment front end module (EFEM) and a sorter are known. As an example of the above-described substrate carrier, a front opening unified pod (FOUP) is known.

For example, as disclosed in Patent Literature 1, the substrate transfer hand including a base part coupled to the hand tip portion of the robot arm, and a substrate holding (retaining) part coupled to this base part is widely used. The substrate transfer robot transfers the substrate while holding the substrate by the substrate holding part. The substrate transfer robot inserts the substrate holding part into the inside of the substrate carrier docked to the load port through an opening formed in the substrate carrier, to pass the substrate to the substrate carrier and receive the substrate from the substrate carrier.

CITATION LIST

Patent Literature

Patent Literature 1: Japanese-Laid Open Patent Application Publication No. 2008-28134

SUMMARY OF INVENTION

Technical Problem

In a case where a "hand axis" is defined as a straight line connecting the base end portion of the substrate transfer hand to the tip end portion of the substrate transfer hand, the base part and the substrate holding part are disposed in series along the hand axis in the conventional substrate transfer hand, and the conventional substrate transfer hand is substantially symmetric in a right-and-left direction with respect to the hand axis. In a case where the substrate transfer robot inserts the substrate holding part of the substrate transfer hand into the substrate carrier, the robot corrects the posture of the substrate transfer hand at a location that is in front of the opening of the load port which is communicated with the opening of the substrate carrier so that the hand axis and an insertion direction of the substrate into the substrate carrier become parallel to each other. After that, the robot moves the substrate holding part toward the opening of the load port.

As in the example of Patent Literature 1, the interior of the transfer room of the substrate transfer and loading device has a rectangular shape in a top plan view. A sufficiently wide space is formed at the location (location closer to the interior of the transfer room) that is in front of the opening of the load port, to correct the posture of the substrate transfer hand so that the hand axis and the insertion direction of the substrate into the substrate carrier become parallel to each other.

Solution to Problem

The applicant of the present application studied placing at least one constituent of the substrate transfer and loading device, at a corner region inside the casing which is a portion of a space of the transfer room in the conventional example, by further reducing the size of the substrate transfer and loading device. However, in the conventional substrate transfer hand, in a case where this constituent is located on an extended line of the opening of the load port, it is difficult to ensure a sufficiently wide space to correct the posture of the substrate transfer hand so that the hand axis and the insertion direction of the substrate into the substrate carrier become parallel to each other, without increasing the size of the casing.

In view of the above, according to an aspect of the present invention, a substrate transfer hand coupled to a robot arm, comprises a base part coupled to the robot arm; and a substrate holding part coupled to the base part to hold a substrate, wherein when viewed in a substrate perpendicular line direction perpendicular to the substrate held by the substrate holding part, the substrate transfer hand is bent at a coupling portion at which the base part and the substrate holding part are coupled to each other or a region which is in the vicinity of the coupling portion, and the base part and the substrate holding part have a V-shape, as a whole. The V-shape may include a circular-arc shape or a U-shape formed by rounding the pointed portion of the V-shape.

According to another aspect of the present invention, a substrate transfer hand coupled to a robot arm, comprises: a base part coupled to the robot arm so that the base part is rotatable around a joint axis line defined in a hand tip portion of the robot arm; and a substrate holding part coupled to the base part to hold a substrate, wherein in a case where when viewed in a substrate perpendicular line direction perpendicular to the substrate held by the substrate holding part, an intermediate point is defined as a middle point between points at which a peripheral edge of the substrate and a peripheral edge of the substrate holding part overlap with each other in a region which is closer to the base part than a center point of the substrate, a first reference line is defined as a straight line passing through a point on the joint axis line and the intermediate point, and a second reference line is defined as a straight line passing through the center point of the substrate and the intermediate point, an angle formed between the first reference line and the second reference line is larger than 0 degree and smaller than 180 degrees.

According to another aspect of the present invention, a substrate transfer hand coupled to a robot arm comprises: a base part coupled to the robot arm so that the base part is rotatable around a joint axis line defined in a hand tip portion of the robot arm; and a substrate holding part coupled to the base part to hold a substrate, wherein in a case where when viewed in a substrate perpendicular line direction perpendicular to the substrate held by the substrate holding part, an intermediate point is defined as a middle point between points at which a peripheral edge of the substrate and a peripheral edge of the substrate holding part overlap with each other in a region which is closer to the base part than a center point of the substrate, and a reference line is defined as a straight line passing through the center point of the substrate and the intermediate point, the joint axis line is offset from the reference line.

According to another aspect of the present invention, a substrate transfer hand coupled to a robot arm comprises: a base part coupled to the robot arm so that the base part is rotatable around a joint axis line defined in a hand tip portion of the robot arm; and a substrate holding part coupled to the base part to hold a substrate, wherein in a case where when viewed in a substrate perpendicular line direction perpendicular to the substrate held by the substrate holding part, an intermediate point is defined as a middle point between points at which a peripheral edge of the substrate and a peripheral edge of the substrate holding part overlap with each other in a region which is closer to the base part than a center point of the substrate, and a reference line is defined as a straight line passing through a point on the joint axis line and the intermediate point, the center point of the substrate is offset from the reference line.

According to an aspect of the present invention, a substrate transfer robot comprises a base; a robot arm having a base end portion coupled to the base so that the robot arm is rotatable; and the substrate transfer hand, which is coupled to a tip end portion of the robot arm.

According to an aspect of the present invention, a substrate transfer and loading device which transfers and loads a substrate (device for transferring and loading a substrate) between a substrate carrier accommodating the substrate therein and a semiconductor process treatment device, or between substrate carriers, comprises a casing formed with a transfer room in an inside thereof; a plurality of load ports provided at a wall of the casing; and the substrate transfer robot which is disposed in the transfer room and transfers and loads the substrate.

In the above-described substrate transfer hand, substrate transfer robot, and substrate transfer and loading device, the movement region (range) of the substrate transfer hand and the robot arm in a case where the substrate is passed to and taken out of the substrate carrier provided at a most distant location from the base end portion of the robot arm, can be reduced, compared to a case where the conventional substrate transfer hand is used. Therefore, an object can be disposed in a region other than the movement region of the substrate transfer hand and the robot arm inside the transfer room (e.g., at a corner region inside the transfer room).

Advantageous Effects of Invention

In accordance with the present invention, the movement region of the substrate transfer hand and the robot arm in the transfer room can be reduced, compared to a case where the conventional substrate transfer hand is used, and an object can be disposed in a region other than the movement region of the substrate transfer hand and the robot arm.

DESCRIPTION OF EMBODIMENTS

Hereinafter, the embodiment of the present invention will be described with reference to the drawings.

[Schematic Configuration of Substrate Treatment Equipment 100]

Figure 1:
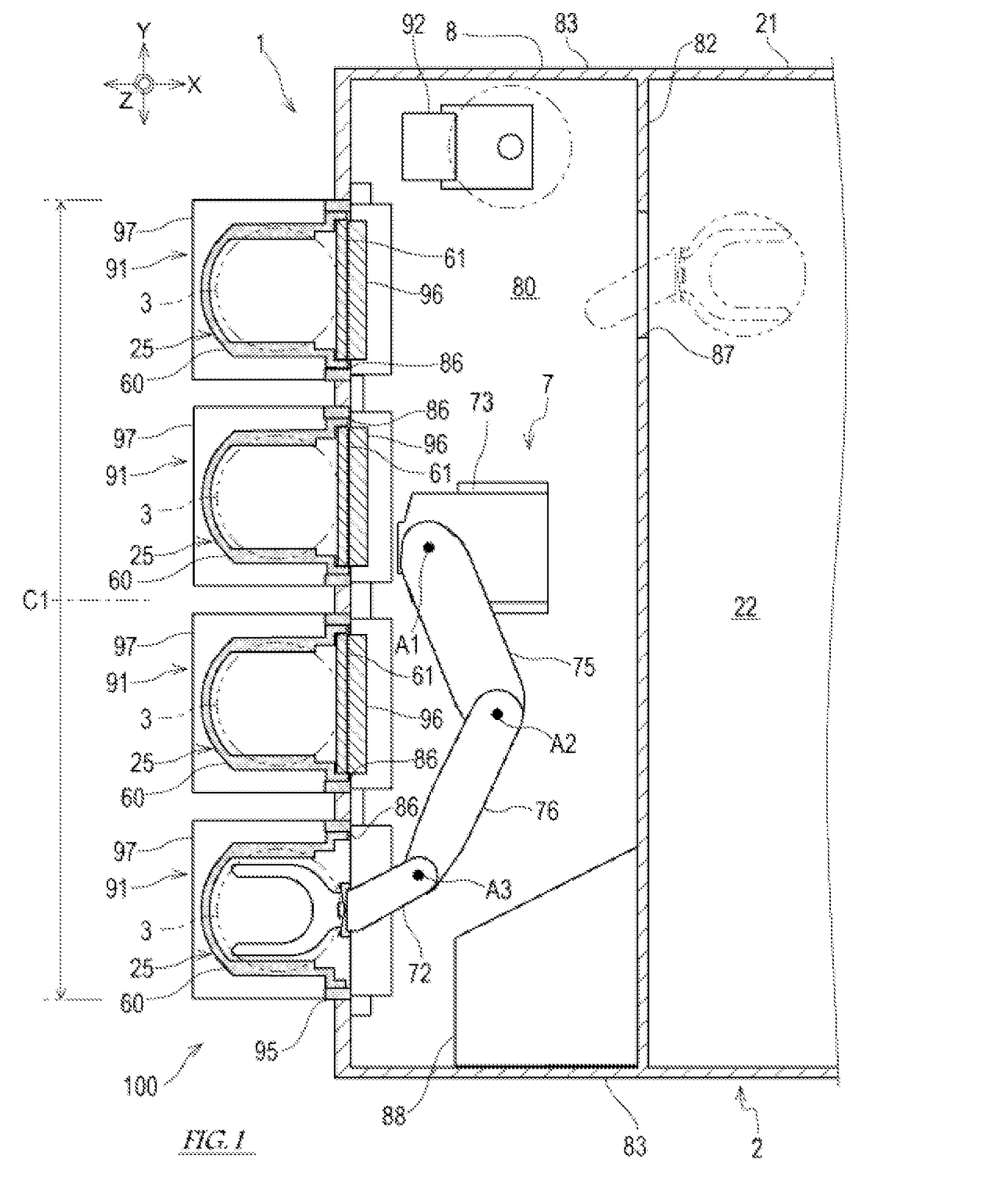
FIG. 1 is a schematic plan view of substrate treatment equipment.
Figure 2:
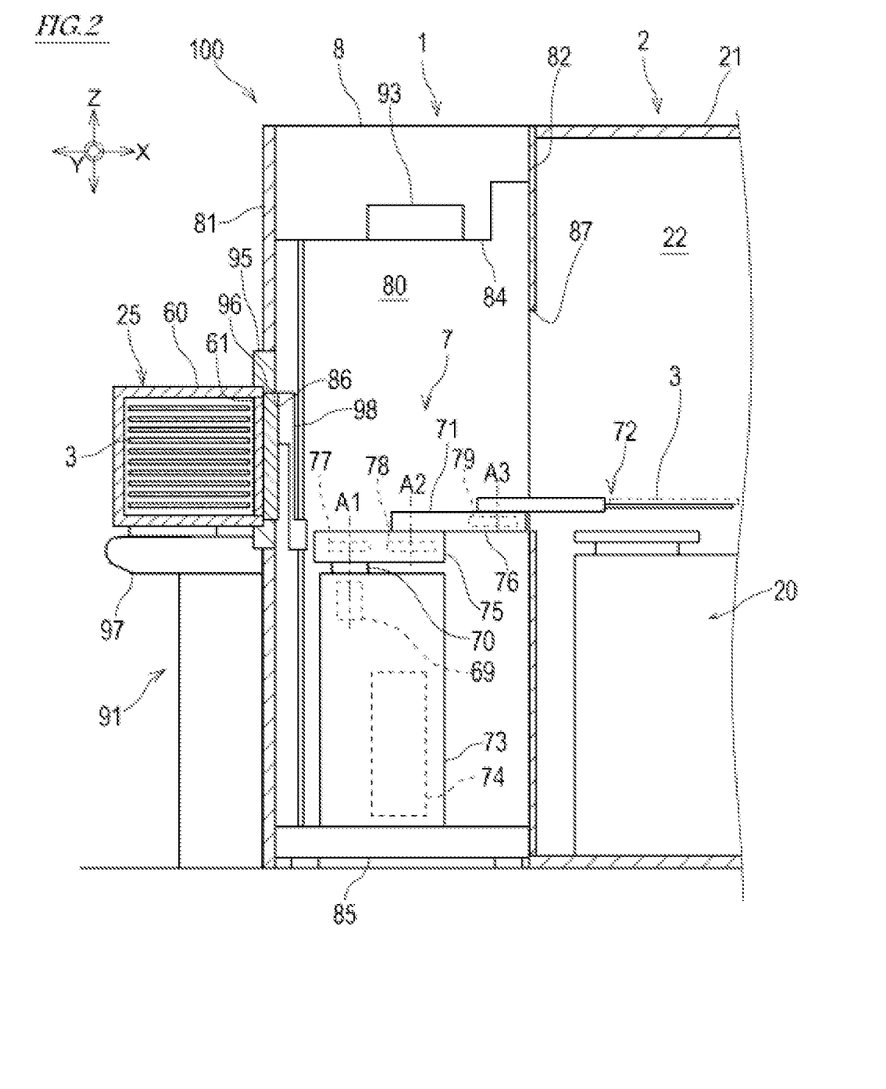
FIG. 2 is a schematic side view of the substrate treatment equipment.

Initially, the schematic configuration of substrate treatment equipment 100 will be described with reference to FIGS. 1 and 2. The substrate treatment equipment 100 is provided with a substrate transfer and loading device (device for transferring and loading a substrate) 1 comprising a substrate transfer robot 7 including a substrate transfer hand 72 according to the embodiment of the present invention.

The substrate treatment equipment 100 includes the substrate transfer and loading device 1 and a process treatment device 2. In the substrate treatment equipment 100 of the present embodiment, the substrate transfer and loading device 1 is a front end module configured to transfer and load a substrate 3 between a substrate carrier 25 and the process treatment device 2. Alternatively, the substrate transfer and loading device 1 may be a sorter which transfers and loads the substrate 3 between the substrate carrier 25 and another substrate carrier 25. The substrate transfer and loading device 1 is designed to comply with the rules of semiconductor equipment and materials international (SEMI) standard or the like.

The process treatment device 2 is a device or a device group which performs at least one process treatment to the substrate 3, such as a thermal treatment, an impurity implantation treatment, a thin film formation treatment, a lithography treatment, a washing (cleaning) treatment, and a flattening treatment. Note that the process treatment device 2 may perform treatments different from the above-described treatments, to the substrate 3.

The process treatment device 2 includes a device body 20 which performs a treatment to the substrate 3, a casing 21 accommodating therein the device body 20, and an adjustment device (not shown) which adjusts an ambient gas in a treatment room 22 formed inside the casing 21. The adjustment device may be realized by, for example, a fan filter unit.

The substrate transfer and loading device 1 is adjacent to the process treatment device 2. The substrate transfer and loading device 1 serves as an interface section which passes (gives) and receives the substrate 3 between each of the substrate carriers 25 and the process treatment device 2. Each of the substrate carriers 25 is a transportable container which can accommodate a number of substrates 3 therein.

Each of the substrate carriers 25 includes a container body 60 accommodating the substrate 3 therein, and a container door 61 which is detachably mounted on the container body 60 or is openable and closable. The container body 60 has a substantially box-shape having an entrance/exit which opens to one side. This entrance/exit can be opened and closed by the container door 61. Inside the container body 60, a number of racks are arranged in a vertical direction Z so that a number of substrates 3 can be accommodated in a state in which they are arranged at equal intervals in the vertical direction Z.

[Configuration of Substrate Transfer and Loading Device 1]

Next, the substrate transfer and loading device 1 will be described in detail. The substrate transfer and loading device 1 includes a substrate transfer robot 7, an aligner 92 which corrects the orientation of the substrate 3, an adjustment device 93, a casing (housing) 8 accommodating the substrate transfer robot 7, the aligner 92, and the adjustment device 93, and load ports 91.

The casing 8 has a rectangular shape in which a dimension in a second direction Y is larger than a dimension in a first direction X. The "first direction X" is a horizontal direction. The "second direction Y" is a horizontal direction perpendicular to the first direction X. The casing 8 includes a front wall 81 and a rear wall 82 which face each other and are spaced apart from each other in the first direction X, a pair of side walls 83 which face each other and are spaced apart from each other in the second direction Y, a top plate 84, and a bottom plate 85. By these walls and plates, a transfer room 80 is formed inside the casing 8. In the description, a side in the first direction X where the front wall 81 is present from the perspective of the transfer room 80 will be referred to as "front", and a side in the first direction X which is opposite to the front will be referred to as "rear".

The transfer room 80 is a closed space with a high level of cleanliness. The transfer room 80 is filled with a specified ambient gas. The adjustment device 93 is a device which performs a contamination control for the transfer room 80. The adjustment device 93 controls floating fine particles in the ambient gas of the transfer room 80 at a predetermined cleanliness level or lower. As necessary, the adjustment device 93 controls environmental conditions of the transfer room 80, such as a temperature, a humidity (moisture), and a pressure.

The rear wall 82 is provided with a rear opening 87. The rear wall 82 partitions the interior of the casing 8 into a treatment room 22 of the process treatment device 2 and the transfer room 80 of the substrate transfer and loading device 1, in the first direction X. Through the rear opening 87, the treatment room 22 and the transfer room 80 are in communication with each other.

The load ports 91 are provided at the front wall 81 of the casing 8. In the present embodiment, four load ports 91 are provided at the front wall 81 and arranged in the second direction Y. Each of the load ports 91 has functions of docking the substrate carrier 25 to the substrate transfer and loading device 1, undocking the substrate carrier 25 from the substrate transfer and loading device 1, supporting the substrate carrier 25, and opening/closing the substrate carrier 25.

The plurality of load ports 91 are arranged in the second direction Y along the front wall 81 of the casing 8 and form a load port row. A joint axis line A1 defined in the base end portion of a robot arm 71 which will be described later is located on one side in the second direction Y, with respect to a center C1 of the load port row in the second direction. More specifically, in a case where the substrate transfer hand 72 has a configuration of FIG. 1, the joint axis line A1 is located on a first side (upper side in FIG. 1) in the second direction Y, with respect to the center C1 of the load port row in the second direction. In a case where the substrate transfer hand 72 has a configuration of FIG. 7, the joint axis line A1 may be located on a second side (lower side in FIG. 1) in the second direction Y, with respect to the center C1 of the load port row in the second direction. By this setting, an offset amount in the second direction Y, of a substrate holding part 5, which occurs due to a variation in the hand configuration, can be cancelled by changing the location of the joint axis line A1.

Each of the load ports 91 includes an opening frame 95, a support base 97, and an opener 98. The opening frame 95 forms a portion of the front wall 81 of the casing 8. An opening 86 of the load port 91 which is defined by the opening frame 95 is also an opening at the front side of the casing 8. Through the opening 86 of the load port 91, the substrate carrier 25 docked to the substrate transfer and loading device 1 and the transfer room 80 are in communication with each other.

The support base 97 is disposed just in front of the opening 86 of the load port 91. The support base 97 has a function of supporting the substrate carrier 25 placed thereon, and a function of holding (retaining) the substrate carrier 25. The substrate carrier 25 placed on and held (retained) by the support base 97 is positioned so that the entire periphery of the entrance/exit of the container body 60 contacts the opening frame 95 and the container door 61 overlaps with the opening 86 of the load port 91 in the first direction X.

The opener 98 includes an opener door 96 which opens and closes the opening 86 of the load port 91, and a driving mechanism therefor. The opener 98 moves the container door 61 of the substrate carrier 25 and the opener door 96 together into the transfer room 80, to open the opening 86 of the load port 91.

Figure 3:
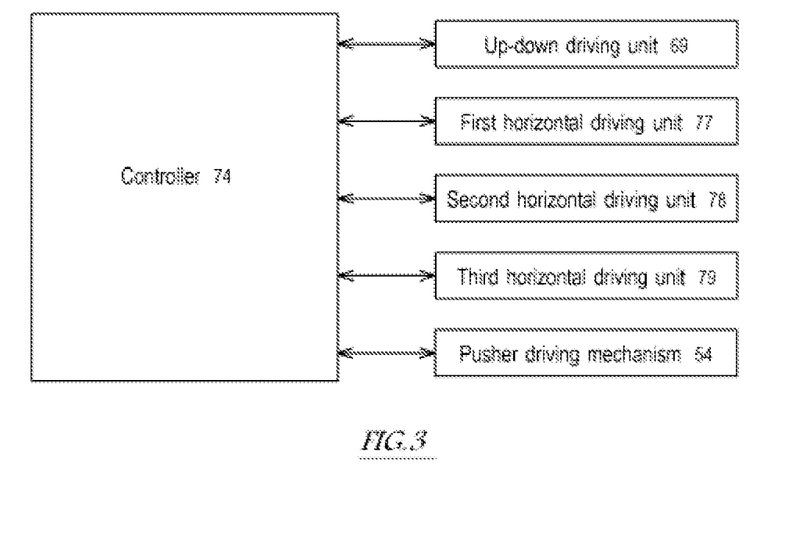
FIG. 3 is a block diagram showing the configuration of a control system of a substrate transfer robot.

FIG. 3 is a block diagram showing the configuration of a control system of the substrate transfer robot 7. As shown in FIGS. 1 to 3, the substrate transfer robot 7 includes the robot arm (hereinafter will be simply referred to as "arm 71"), the substrate transfer hand (hereinafter will be simply referred to as "hand 72") coupled to the hand tip portion of the arm 71, a base 73 supporting the arm 71, and a controller 74 which controls the operation of the substrate transfer robot 7. In the present embodiment, the substrate transfer robot 7 is a horizontal articulated (multi-joint) robot. Note that the base 73 is disposed at a center region in the second direction Y in the transfer room 80.

The arm 71 includes a plurality of links 75, 76 coupled to each other in turn from its base end portion toward its tip end portion. Regarding the arm 71 and the hand 72, an end portion which is close to the base 73 will be referred to as "base (proximal) end portion", and an end portion which is distant from the base 73 will be referred to as "tip (distal) end portion". Joint axis lines A1 to A3 perpendicular to coupling portions of links 75, 76 are defined in the arm 71. Inside the links 75, 76, horizontal driving units 77, 78, 79 are provided to independently displace the links 75, 76 around the joint axis lines A1 to A3.

The arm 71 includes at its base end portion an up-down shaft 70 which is movable in the vertical direction Z with respect to the base 73. An up-down driving unit 69 extends and contracts the up-down shaft 70 in the vertical direction Z, with respect to the base 73. Each of the horizontal driving units 77, 78, 79 and the up-down driving unit 69 includes, for example, a servo motor which is angularly displaced in response to a signal provided by the controller 74, a driving force transmission mechanism which transmits a driving force of the servo motor to a link body, and a position detector which detects an angular displacement of the servo motor (the servo motor, the driving force transmission mechanism, and the position detector are not shown in the drawings).

The hand 72 is coupled to the hand tip portion which is the tip end portion of the arm 71 with the above-described configuration. The horizontal driving unit 79 rotates the hand 72 relative to the arm 71 around the joint axis line A3. The hand 72 includes a base part 4 coupled to the hand tip portion of the arm 71, and the substrate holding part 5 joined to the base part 4. The configuration of the hand 72 will be described in detail later.

The controller 74 is a computation (calculation) control device including a computer. For example, the controller 74 includes a processor such as a microcontroller, CPU, MPU, PLC, DSP, ASIC or FPGA, and a storage section such as ROM or RAM (these are not shown). The storage section contains therein programs executed by the processor, fixed data, and the like. In addition, the storage section contains therein teaching point data used to control the operation of the substrate transfer robot 7, shape and dimension data of the arm 71 and the hand 72, shape and dimension data of the substrate 3 held by the hand 72, and the like. The processor of the controller 74 reads out software such as the programs stored in the storage section and executes the software, to perform processing used to control the operation of the substrate transfer robot 7. The controller 74 may be a single computer which performs a centralized control to execute processing or may be a plurality of computers which perform a distributed control to perform the processing.

The controller 74 calculates (computes) a target pause of the hand 72 after a passage of a predetermined control time, based on a pause (position and posture) of the hand 72 corresponding to a rotation position detected by each position detector and the teaching point data stored in the storage section. Then, the controller 74 outputs control commands to servo amplifiers so that the hand 72 takes the target pause after a passage of the predetermined control time. In response to the commands, the servo amplifiers supply driving electric power to the servo motors, respectively. In this way, the hand 72 can be moved to take a desired pause.

[Configuration of Substrate Transfer Hand 72]

Figure 4:
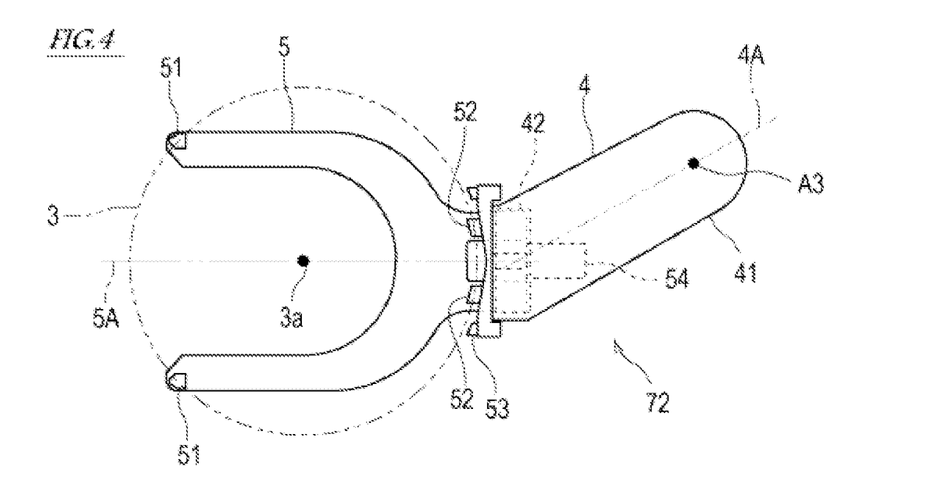
FIG. 4 is a view showing a substrate transfer hand when viewed in a substrate perpendicular line direction.

The configuration of the hand 72 will be described in detail. FIG. 4 is a view showing the substrate transfer hand 72 when viewed in a substrate perpendicular line direction. The "substrate perpendicular line direction" is defined as a direction perpendicular to the primary (main) surface of the substrate 3 held (retained) by the substrate holding part 5 of the hand 72.

A first center line 4A passing through the base end portion and tip end portion of the base part 4 of the hand 72 when viewed in the substrate perpendicular line direction is defined in the base part 4. The first center line 4A is a straight line perpendicular (orthogonal) to the substrate perpendicular line direction. The first center line 4A intersects (crosses) the joint axis line A3. When viewed in the substrate perpendicular line direction, the base part 4 is substantially symmetric with respect to the first center line 4A, except a portion of the tip end portion of the base part 4.

The base part 4 is formed by a hollow casing 41. The base end portion of the base part 4 is coupled to the hand tip portion of the arm 71 so that the base part 4 is rotatable around the joint axis line A3. A coupling portion 42 is provided at the tip end portion of the base part 4. The substrate holding part 5 is coupled to the coupling portion 42. The base end portion of the substrate holding part 5 is inserted into the casing 41 from the tip end portion of the casing 41 and coupled to the coupling portion 42. The substrate holding part 5 may be fastened to the coupling portion 42, by, for example, a fastening member (not shown).

The substrate holding part 5 of the hand 72 is a thin plate member with a Y-shape having forked portions at its tip end side. The substrate holding part 5 of the hand 72 is also referred to as a blade or a fork. The configuration of the substrate holding part 5 is not limited to that of the present embodiment. For example, the substrate holding part 5 may have any configuration so long as the substrate holding part 5 is capable of holding (retaining) the substrate 3 by the hand 72 by, for example, fitting, adsorption, sandwiching, or other means.

A second center line 5A passing through the base end portion of the substrate holding part 5 and a center point 3a of the substrate 3 held by the substrate holding part 5 when viewed in the substrate perpendicular line direction is defined in the substrate holding part 5. The second center line 5A is a straight line perpendicular (orthogonal) to the substrate perpendicular line direction. The substrate holding part 5 of the present embodiment is substantially symmetric with respect to the second center line 5A, when viewed in the substrate perpendicular line direction. It is sufficient that the second center line 5A passes through the center point 3a of the substrate 5 held by the substrate holding part 5. The configuration of the substrate holding part 5 is not limited to the configuration in which the substrate holding part 5 is symmetric with respect to the second center line 5A.

The forked tip end portions of the substrate holding part 5 are provided with a pair of front guides 51, respectively. The base end portion of the substrate holding part 5 is provided with a pair of rear guides 52 corresponding to the pair of front guides 51, respectively. The pair of front guides 51 and the pair of rear guides 52 serve to support the substrate 3 from the underside. The positions and shapes of the pair of front guides 51 and the pair of rear guides 52 are set to support the substrate 3 from the underside.

The hand 72 further includes a holding mechanism for allowing the substrate 3 placed on the substrate holding part 5 to be held by the substrate holding part 5. Holding the substrate 3 includes holding the substrate 3 placed on the substrate holding part 5 while preventing the substrate 3 from being disengaged from the substrate holding part 5 by, for example, fitting, adsorption, sandwiching, or other means. In the present embodiment, the hand 72 includes a holding mechanism for holding the substrate 5 by sandwiching. This holding mechanism includes the pair of front guides 51, pushers 53, and a driving mechanism 54 for driving the pushers 53.

The pushers 53 are provided at the base end side of the substrate holding part 5 and are supported on the tip end portion of the base part 4. The driving mechanism 54 of the pushers 53 is provided inside the casing 41 forming the base part 4. The driving mechanism 54 advances and retracts the pushers 53 in parallel with the second center line 5A. The driving mechanism 54 is constituted by, for example, an actuator such as an air cylinder. The operation of the driving mechanism 54 is controlled by the controller 74.

When the substrate 3 is placed on the upper surface of the substrate holding part 5, the peripheral edge of the substrate 3 is supported from the underside by the pair of front guides 51 and the pair of rear guides 52. In this state, the pushers 53 are advanced toward the tip end of the substrate holding part 5, and push the side surface of the substrate 3 to the pair of front guides 51. In this way, the substrate 3 is gripped by the pushers 53 and the pair of front guides 51, and held by the hand 72.

When viewed in the substrate perpendicular line direction, the hand 72 with the above-described configuration is bent at the coupling portion 42 at which the base part 4 and the substrate holding part 5 are coupled to each other or a region which is in the vicinity of the coupling portion 42, and the base part 4 and the substrate holding part 5 have a V-shape, as a whole. This V-shape may include a circular-arc shape or a U-shape formed by rounding the pointed portion of the V-shape. The region which is in the vicinity of the coupling portion 42 of the base part 4 is defined as a region which is close to the coupling portion 42 and is in a range from the tip end of the base part 4 to 30% of the whole length of the base part 4, in the hand 72.

In the hand 72, when viewed in the substrate perpendicular line direction, the first center line 4A which is the center line of the base part 4 and the second center line 5A which is the center line of the substrate holding part 5 intersect (cross) each other. When viewed in the substrate perpendicular line direction, an angle formed between the first center line 4A and the second center line 5A may be larger than 90 degrees and smaller than 180 degrees. If the angle formed between the first center line 4A and the second center line 5A is smaller than 90 degrees, it is difficult to handle the hand 72. The angle formed between the first center line 4A and the second center line 5A may be set according to a shape of an object 88 (see FIG. 1) provided on an extended line of the opening 86 of the load port 91 inside the casing 8.

Figure 5:
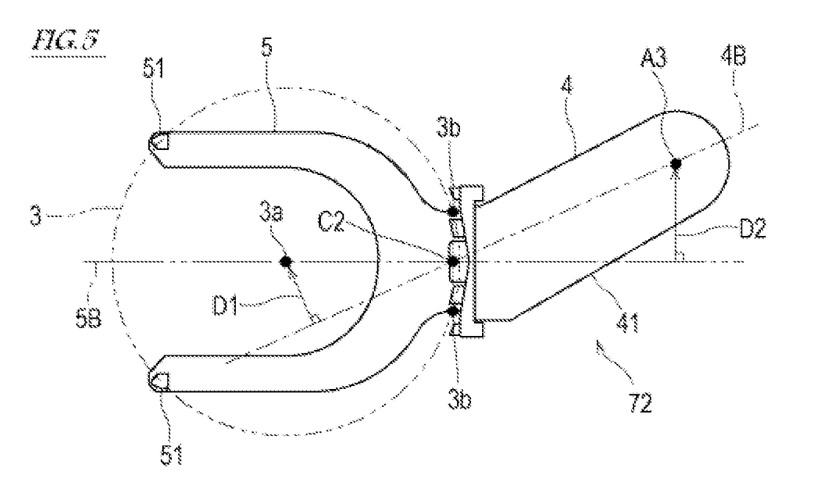
FIG. 5 is a view showing the substrate transfer hand when viewed in the substrate perpendicular line direction.

In the hand 72 of FIG. 5, when viewed in the substrate perpendicular line direction, an intermediate point C2 is defined as a middle point between points 3b at which the peripheral edge of the substrate 3 and the peripheral edge of the substrate holding part 5 overlap with each other in a region which is closer to the base part 4 than the center point 3a of the substrate 3 held by the substrate holding part 5, a first reference line 4B is defined as a straight line passing through a point on the joint axis line A3 and the intermediate point C2, and a second reference line 5B is defined as a straight line passing through the center point 3a of the substrate 3 and the intermediate point C2.

As shown in FIG. 5, in the hand 72, when viewed in the substrate perpendicular line direction, an angle formed between the first reference line 4B and the second reference line 5B is larger than 0 degree and smaller than 180 degrees. In the hand 72, when viewed in the substrate perpendicular line direction, the center point 3a of the substrate 3 is offset by an offset amount D1 from the first reference line 4B. In the hand 72, when viewed in the substrate perpendicular line direction, the joint axis line A3 is offset by an offset amount D2 from the second reference line 5B.

[Operation of Substrate Transfer and Loading Device 1]

Now, an example of the operation of the substrate transfer and loading device 1 will be described with reference to FIGS. 6A to 6D. FIGS. 6A to 6D are views for explaining a change of the substrate transfer robot 7 in the substrate transfer and loading device 1.

In the substrate transfer and loading device 1, the object 88 is disposed at the corner region of the transfer room 80. This object 88 may be at least one of the constituents (components) of the substrate transfer and loading device 1. Between the object 88 and the opening 86 of the load port 91E located at the end of the substrate transfer and loading device 1 in the second direction Y, a gap G in the first direction X is formed. A dimension of the gap G in the first direction X is smaller than the diameter of the substrate 3. In a state in which a portion of the substrate 3 is inserted into the substrate carrier 25, entry (advancement) of the substrate 3 into this gap G is allowed. Inside the transfer room 80, the object 88 protrudes in the second direction Y to a location conforming to that of the opening 86 of the load port 91E. A surface 88a of the object 88, exposed in the transfer room 80 and facing in the second direction Y, is inclined toward the center of the transfer room 80 in the second direction Y, from the front to the rear.

Figure 6A:
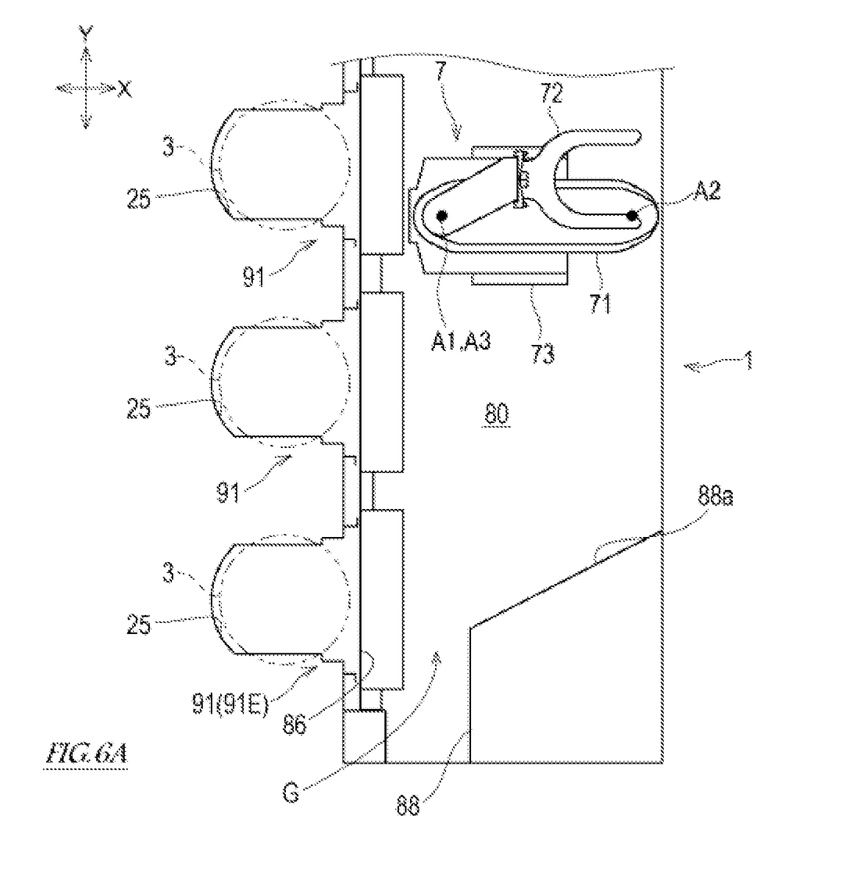
FIG. 6(A) is a view for explaining a change of the substrate transfer robot in a substrate transfer and loading device (device for transferring and loading the substrate), and showing the substrate transfer robot in a stand-by state.

The substrate transfer robot 7 of FIG. 6A is in a stand-by state. The links 75, 76 and the hand 72 overlap with each other in the vertical direction Z. Hereinafter, the operation of the substrate transfer robot 7 from the stand-by state, which moves to the substrate carrier 25 docked to the load port 91 (91E) provided at the end of the substrate transfer and loading device 1 in the second direction Y, and takes the substrate 3 out of the substrate carrier 25, will be described. The operation of the substrate transfer robot 7 is controlled by the controller 74, although this is not specifically described.

Figure 6B:
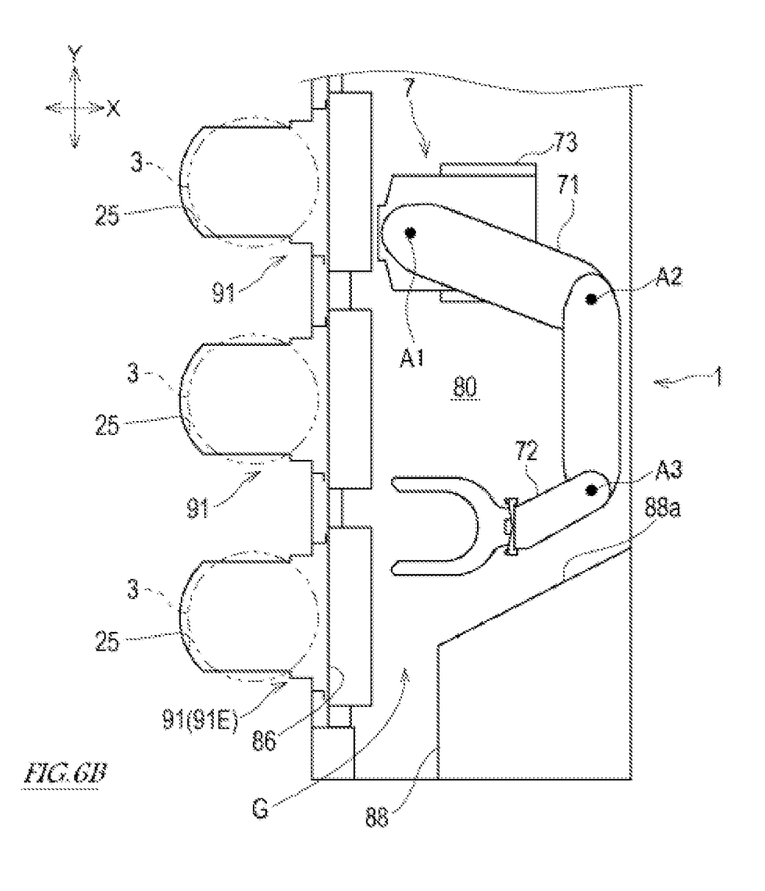
FIG. 6(B) is a view for explaining a change of the substrate transfer robot in the substrate transfer and loading device, and showing the substrate transfer robot in a state in which an arm is stretched (extended) from the stand-by state.

Initially, the substrate transfer robot 7 changes from the state of FIG. 6A to the state of FIG. 6B. In the substrate transfer robot 7 shown in FIG. 5, the tip end portion of the hand 72 faces the load port 91E, the second center line 5A defined in the hand 72 and the opening direction (the first direction X) of the opening 86 of the load port 91E are parallel to each other, and the tip end portion of the hand 72 is located apart in the first direction X from the opening 86 of the load port 91E.

While the substrate transfer robot 7 is changing from the stand-by state of FIG. 6A to the state of FIG. 6B, the hand 72 and the arm 71 move within a movement region inside the transfer room 80. In the transfer room 80, the movement region in which the arm 71 is movable and a non-movement region which the arm 71 cannot enter, are defined. The non-movement region is a region with a predetermined dimension in the first direction X, from the front wall 81 of the casing 8. This non-movement region is utilized by the load port 91 (the opener 98) to open and close the container door 61 and open and close the opener door 96. The movement region is a region other than the non-movement region, in the transfer room 80.

Figure 6C:
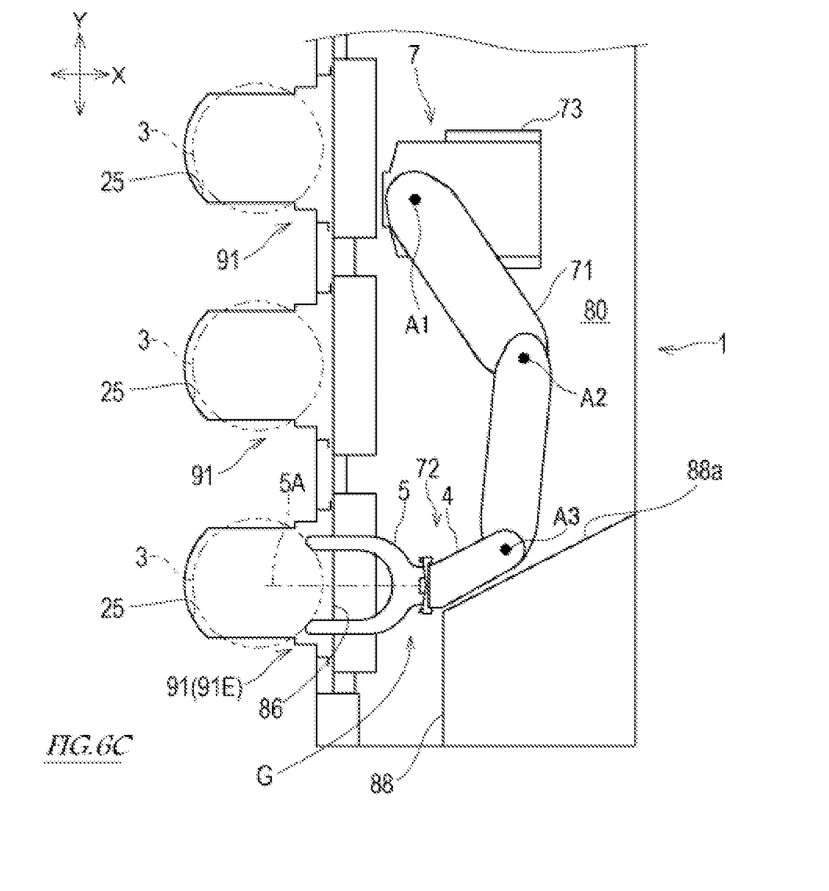
FIG. 6(C) is a view for explaining a change of the substrate transfer robot in the substrate transfer and loading device, and showing the substrate transfer robot in a state in which a substrate holding (retaining) part has moved to a location of an opening of a load port, which is closer to a transfer room.

Then, the substrate transfer robot 7 changes from the state of FIG. 6B to the state of FIG. 6C. In the substrate transfer robot 7 shown in FIG. 6C, the tip end portion of the substrate holding part 5 of the hand 72 has entered (has been advanced into) the substrate carrier 25. At this time, at least a portion of the hand 72 is located in the non-movement region. While the substrate transfer robot 7 is changing from the state of FIG. 6B to the state of FIG. 6C, the hand 72 moves toward the opening 86 of the load port 91 along the inclined surface 88a of the object 88, while maintaining a state in which the second center line 5A defined in the hand 72 and the opening direction (the first direction X) of the opening 86 of the load port 91 are parallel to each other.

In the hand 72 in the state of FIG. 6C, the second center line 5A which is the center line of the substrate holding part 5 is parallel to the opening direction of the opening 86, and the first center line 4A which is the center line of the base part 4 is inclined with respect to the opening direction of the opening 86. As a result, the base end portion of the base part 4 is closer to the center of the transfer room 80 in the second direction Y than the substrate holding part 5. Therefore, the object 88 can protrude toward the center of the transfer room 80 in the second direction Y, while preventing interference with the hand 72 in the state of FIG. 6C. In the present embodiment, the surface 88a of the object 88, facing the center of the transfer room 80 in the second direction Y, is inclined toward the center in the second direction Y, from the front to the rear. This allows the object 88 to protrude to a greater degree toward the center of the transfer room 80 in the second direction Y. In other words, the surface 88a of the object 88, facing the center of the transfer room 80 in the second direction Y, is inclined toward the center in the second direction Y, from the front to the rear so that access of the hand 72 to the opening 86 is allowed.

Figure 6D:
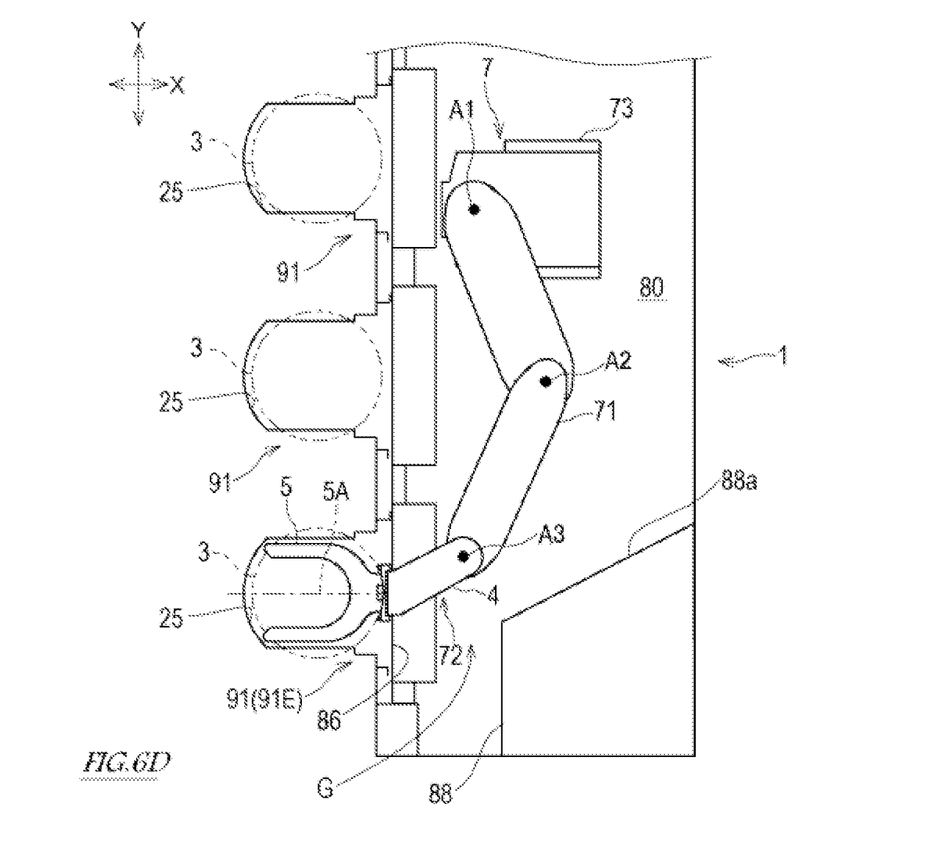
FIG. 6(D) is a view for explaining a change of the substrate transfer robot in the substrate transfer and loading device, and showing the substrate transfer robot in a state in which the substrate holding part is inserted into a substrate carrier.

Then, the substrate transfer robot 7 changes from the state of FIG. 6C to the state of FIG. 6D. In the substrate transfer robot 7 shown in FIG. 6D, the substrate holding part 5 has entered (has been advanced into) the inner region (region inward of the opening 86) of the substrate carrier 25. Thus, in a state in which the substrate holding part 5 has entered (has been advanced into) the inner region of the substrate carrier 25, the substrate holding part 5 receives the substrate 3 from the substrate carrier 25 and passes the substrate 3 to the substrate carrier 25.

While the substrate transfer robot 7 is changing from the state of FIG. 6C to the state of FIG. 6D, the hand 72 moves forward while maintaining a state in which the second center line 5A and the opening direction of the opening 86 are parallel to each other. Note that the opening direction of the opening 86 is parallel to a direction in which the substrate 3 is inserted into and taken out of the substrate carrier 25. Thus, while the substrate holding part 5 is located inside the substrate carrier 25, the substrate holding part 5 moves in the direction parallel to the direction in which the substrate 3 is inserted into and taken out of the substrate carrier 25. Therefore, the substrate 3 can be stably inserted and taken out without scraping or oscillation of the substrate 3, inside the substrate carrier 25.

As described above, the substrate transfer hand 72 of the present embodiment includes the base part 4 coupled to the robot arm 71, and the substrate holding part 5 coupled to the base part 4 to hold the substrate 3. When viewed in the substrate perpendicular line direction defined as the direction perpendicular to the substrate 3 held by the substrate holding part 5, the substrate transfer hand 72 is bent at the coupling portion 42 at which the base part 4 and the substrate holding part 5 are coupled to each other or a region which is in the vicinity of the coupling portion 42, and the base part 4 and the substrate holding part 5 have a V-shape, as a whole.

In the substrate transfer hand 72 of the present embodiment, in a case where when viewed in the substrate perpendicular line direction, the intermediate point C2 is defined as the middle point between the points 3b at which the peripheral edge of the substrate 3 and the peripheral edge of the substrate holding part 5 overlap with each other in a region which is closer to the base part 4 than the center point 3a of the substrate 3, the first reference line 4B is defined as the straight line passing through the point on the joint axis line A3 and the intermediate point C2, and the second reference line 5B is defined as the straight line passing through the center point 3a of the substrate 3 and the intermediate point C2, the angle formed between the first reference line 4B and the second reference line 5B is larger than 0 degree and smaller than 180 degrees.

In the substrate transfer hand 72 of the present embodiment, when viewed in the substrate perpendicular line direction, the joint axis line A3 is offset from the second reference line 5B, and the center point 3a of the substrate 3 is offset from the first reference line 4B.

The substrate transfer robot 7 of the present embodiment includes the base 73, the robot arm 71 having the base end portion coupled to the base 73 so that the robot arm 71 is rotatable, and the substrate transfer hand 72 coupled to the tip end portion of the robot arm 71.

The substrate transfer and loading device 1 of the present embodiment is configured to transfer and load the substrate 3 between the substrate carrier 25 accommodating the substrate 3 therein and the semiconductor process treatment device 2, or between the substrate carriers 25. The substrate transfer and loading device 1 includes the casing 8 formed with the transfer room 80 in an inside thereof, the plurality of load ports 91 provided at the wall of the casing 8, and the substrate transfer robot 7 disposed in the transfer room 80 and configured to transfer and load the substrate 3.

In the substrate transfer hand 72, the substrate transfer robot 7, and the substrate transfer and loading device 1, when viewed in the substrate perpendicular line direction, the substrate transfer hand 72 has the V-shape. Therefore, in a state in which a portion or a whole of the substrate holding part 5 is inserted into the substrate carrier 25 through the opening 86 of the load port 91, the base part 4 is closer to the base end portion of the robot arm 71 than the substrate holding part 5. In this configuration, the object 88 can be disposed in a region (region on an extended line of the opening 86 of the load port 91 which is close to the transfer room 80) where the base part is located, in a state in which a portion or a whole of the substrate holding part is inserted into the substrate carrier through the opening of the load port, in the conventional substrate transfer hand. Since the substrate transfer hand 72 is bent in the V-shape, the movement region (range) of the substrate transfer hand 72 and the arm 71 inside the transfer room 80, in particular, the movement region of the substrate transfer hand 72 and the arm 71 in a case where the substrate 3 is passed to and taken out of the substrate carrier 25 provided at a most distant location from the base end portion of the arm 71, can be reduced, compared to a case where the conventional substrate transfer hand is used. In a region other than the movement region, the object 88 can be disposed.

In the substrate transfer hand 72 of the present embodiment, the first center line 4A passing through the base end portion and tip end portion of the base part 4 is defined in the base part 4, and the second center line 5A passing through the base end portion of the substrate holding part 5 and the center point 3a of the substrate 5 held by the substrate holding part 5 is defined in the substrate holding part 5. When viewed in the substrate perpendicular line direction, the first center line 4A and the second center line 5A intersect (cross) each other. When viewed in the substrate perpendicular line direction, the angle formed between the first center line 4A and the second center line 5A may be larger than 90 degrees and smaller than 180 degrees.

The preferred embodiment of the present invention has been described above. The present invention may include modifications of the details of the specific structure and/or function of the embodiment, within the scope of the invention. The configurations of the substrate transfer hand 72, the substrate transfer robot 7, and the substrate transfer and loading device 1 may be modified as follows, for example.

Figure 7:
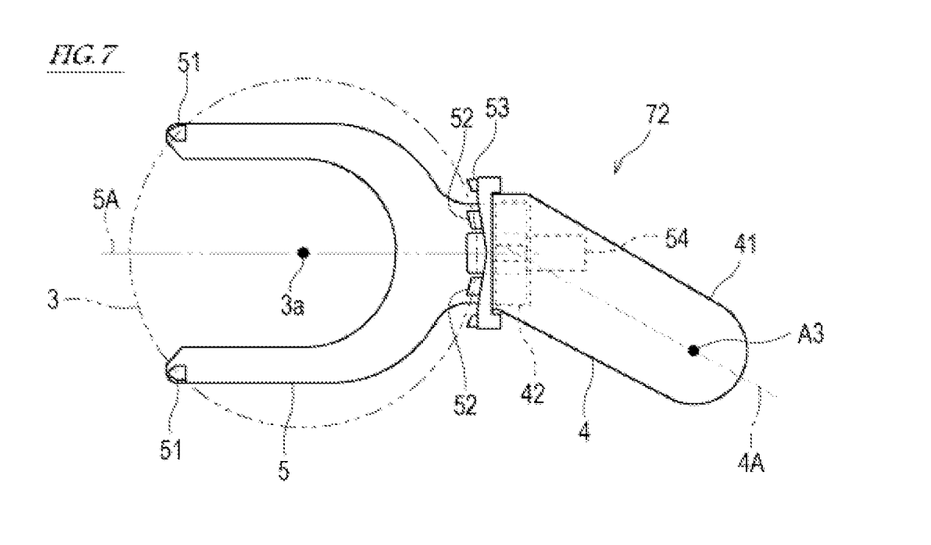
FIG. 7 is a view showing a substrate transfer hand according to a modified example, when viewed in the substrate perpendicular line direction.

FIG. 7 is a view showing a substrate transfer hand according to a modified example, when viewed in the substrate perpendicular line direction. In the hand 72 according to the above-described embodiment, the second center line 5A is rotated between 90 degrees and 180 degrees in a counterclockwise direction, when viewed from the first center line 4A. Alternatively, as shown in FIG. 7, in the hand 72, the second center line 5A may be rotated between 90 degrees and 180 degrees in a clockwise direction, when viewed from the first center line 4A.

REFERENCE SIGNS LIST

1 substrate transfer and loading device
2 process treatment device
3 substrate
3a center point
4 base part
4A first center line
4B first reference line
5 substrate holding part
5A second center line
5B second reference line
7 substrate transfer robot
8 casing
20 device body
21 casing
22 treatment room
25 substrate carrier
41 casing
42 coupling portion
51 front guide
52 rear guide
53 pusher
54 driving mechanism
60 container body
61 container door
69 up-down driving unit
70 up-down shaft
71 arm
72 substrate transfer hand
63 base
74 controller
75 link
76 link
77 horizontal driving unit
78 horizontal driving unit
79 horizontal driving unit
80 transfer room
86 opening
88 object
91, 91E load port
92 aligner
93 adjustment device
95 opening frame
96 opener door
97 support base
98 opener
100 substrate treatment equipment

The invention claimed is:

1. A substrate transfer and loading device configured to transfer and load a substrate (i) between a substrate carrier accommodating the substrate and a semiconductor process treatment device, or (ii) between a plurality of substrate carriers including the substrate carrier accommodating the substrate, the substrate transfer and loading device comprising:
a casing formed with a transfer room in an interior of the casing;
a plurality of load ports including a first load port and a last load port, the plurality of load ports being disposed on a wall of the casing and arranged on the wall of the casing forming a load port row extending from the first load port along a predetermined direction to the last load port; and
a substrate transfer robot disposed in the transfer room and configured to transfer and load the substrate, the substrate transfer robot including:
a base,
a robot arm having a base end portion coupled to the base such that the robot arm is rotatable, the base end portion being disposed closer to the first load port than to the last load port of the plurality of load ports with respect to the predetermined direction, and
a substrate transfer hand coupled to a tip end portion of the robot arm, the substrate transfer hand including:
a base part coupled to the robot arm, and
a substrate holding part configured to hold the substrate, the substrate holding part being coupled to the base part at a coupling portion such that a center line of the substrate holding part and a center line of the base part form a V-shape centered at the coupling portion.

2. The substrate transfer and loading device according to claim 1, wherein the V-shape formed by the center line of the substrate holding part and the center line of the base part has an angle that is greater than 90 degrees and less than 180 degrees.

3. A substrate transfer and loading device configured to transfer and load a substrate (i) between a substrate carrier accommodating the substrate and a semiconductor process treatment device, or (ii) between a plurality of substrate carriers including the substrate carrier accommodating the substrate, the substrate transfer and loading device comprising:
a casing formed with a transfer room in an interior of the casing;
a plurality of load ports including a first load port and a last load port, the plurality of load ports being disposed on a wall of the casing and arranged on the wall of the casing forming a load port row extending from the first load port along a predetermined direction to the last load port; and
a substrate transfer robot disposed in the transfer room and configured to transfer and load the substrate, the substrate transfer robot including:

a base, a robot arm having a base end portion coupled to the base such that the robot arm is rotatable, the base end portion being disposed closer to the first load port than to the last load port of the plurality of load ports with respect to the predetermined direction, and a substrate transfer hand coupled to a tip end portion of the robot arm, the substrate transfer hand including:

a base part coupled to the robot arm such that the base part is rotatable around a joint axis line defined in a hand tip portion of the robot arm, and a substrate holding part configured to hold the substrate, the substrate holding part being coupled to the base part at a coupling portion such that a center line of the substrate holding part and a center line of the base part form an angle centered at the coupling portion, the angle being greater than 0 degrees and less than 180 degrees.

4. A substrate transfer and loading device configured to transfer and load a substrate (i) between a substrate carrier accommodating the substrate and a semiconductor process treatment device, or (ii) between a plurality of substrate carriers including the substrate carrier accommodating the substrate, the substrate transfer and loading device comprising:

a casing formed with a transfer room in an interior of the casing;

a plurality of load ports including a first load port and a last load port, the plurality of load ports being disposed on a wall of the casing and arranged on the wall of the casing forming a load port row extending from the first load port along a predetermined direction to the last load port; and a substrate transfer robot disposed in the transfer room and configured to transfer and load the substrate, the substrate transfer robot including:

a base, a robot arm having a base end portion coupled to the base such that the robot arm is rotatable, the base end portion being disposed closer to the first load port than to the last load port of the plurality of load ports with respect to the predetermined direction, and a substrate transfer hand coupled to a robot arm, the substrate transfer hand including:

a base part coupled to the robot arm such that the base part is rotatable around a joint axis line defined in a hand tip portion of the robot arm, and a substrate holding part configured to hold the substrate, the substrate holding part being coupled to the base part at a coupling portion such that a center line of the substrate holding part and the joint axis line are offset and intersect at the coupling portion.

* * * * *